US012308234B2

(12) United States Patent
Yang et al.

(10) Patent No.: US 12,308,234 B2
(45) Date of Patent: May 20, 2025

(54) METAL MASK HAVING A PLURALITY OF STRIP-SHAPED STRUCTURES

(71) Applicant: Darwin Precisions Corporation, Hsinchu County (TW)

(72) Inventors: Yun-Pei Yang, Hsinchu County (TW); Jen-Shun Lin, Hsinchu County (TW); Yu-Wei Chang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 97 days.

(21) Appl. No.: 17/547,260

(22) Filed: Dec. 10, 2021

(65) Prior Publication Data

US 2023/0064427 A1    Mar. 2, 2023

(30) Foreign Application Priority Data

Aug. 26, 2021    (TW) .................................. 110131682

(51) Int. Cl.
*H01L 21/033*    (2006.01)
*H01L 21/74*    (2006.01)
*H01L 21/762*    (2006.01)

(52) U.S. Cl.
CPC ........ *H01L 21/0334* (2013.01); *H01L 21/743* (2013.01); *H01L 21/76229* (2013.01)

(58) Field of Classification Search
CPC ............... H01L 21/0334; H01L 21/743; H01L 21/76229; H01L 23/585
USPC ........................................................ 257/673
See application file for complete search history.

(56) References Cited

U.S. PATENT DOCUMENTS

| 5,091,212 A | 2/1992 | Sakai et al. |
| 5,694,155 A | 12/1997 | Stapleton et al. |
| 2004/0137161 A1 | 7/2004 | Segawa et al. |
| 2007/0157879 A1 | 7/2007 | Yotsuya |
| 2010/0055810 A1 | 3/2010 | Sung |

(Continued)

FOREIGN PATENT DOCUMENTS

| CN | 100999811 A | 7/2007 |
| CN | 101667529 A | 3/2010 |

(Continued)

*Primary Examiner* — Eliseo Ramos Feliciano
*Assistant Examiner* — Mikka Liu
(74) *Attorney, Agent, or Firm* — WPAT, PC

(57) ABSTRACT

A method of fabricating a metal mask includes receiving a conductive substrate with a first surface, a second surface opposite to the first surface, a third surface connecting the first and second surfaces, and a fourth surface opposite to the third surface and connecting the first and second surfaces. The method further includes forming trenches in a direction from the first surface to the second surface and protrusions in the conductive substrate. The trenches and the protrusions are alternately arranged. The method further includes filling the trenches with an insulation material covering a first area of the protrusions, forming a metal layer on the conductive substrate overlying a second area different from the first area of the protrusions, removing the insulation material, and removing the conductive substrate. The metal layer becomes a metal mask with a three-dimensional structure including strip-shaped structures.

5 Claims, 17 Drawing Sheets

(56) References Cited

U.S. PATENT DOCUMENTS

| | | | |
|---|---|---|---|
| 2011/0109511 A1* | 5/2011 | Andrenko | H01Q 5/40 343/700 MS |
| 2014/0377903 A1 | 12/2014 | Takeda et al. | |
| 2015/0118391 A1* | 4/2015 | Kilhenny | H01L 23/3677 362/373 |
| 2015/0303360 A1* | 10/2015 | Yoo | H01L 33/60 438/27 |
| 2015/0376765 A1 | 12/2015 | Xiong et al. | |
| 2016/0049586 A1 | 2/2016 | Takeda et al. | |
| 2016/0268511 A1 | 9/2016 | Takeda et al. | |
| 2016/0372669 A1 | 12/2016 | Sung | |
| 2017/0186955 A1 | 6/2017 | Takeda et al. | |
| 2018/0277763 A1 | 9/2018 | Takeda et al. | |
| 2019/0123280 A1 | 4/2019 | Takeda et al. | |
| 2019/0259951 A1 | 8/2019 | Seong | |
| 2019/0363257 A1 | 11/2019 | Takeda et al. | |
| 2020/0043696 A1 | 2/2020 | Song | |
| 2020/0227640 A1 | 7/2020 | Seong | |
| 2021/0066601 A1 | 3/2021 | Takeda et al. | |
| 2022/0013753 A1 | 1/2022 | Xu et al. | |
| 2022/0149283 A1 | 5/2022 | Seong | |
| 2022/0157629 A1 | 5/2022 | Antoniolli et al. | |
| 2023/0064427 A1 | 3/2023 | Yang et al. | |

FOREIGN PATENT DOCUMENTS

| | | |
|---|---|---|
| CN | 104561896 A | 4/2015 |
| CN | 105220185 A | 1/2016 |
| CN | 109844974 A | 6/2019 |
| CN | 110211973 A | 9/2019 |
| TW | 565895 B | 12/2003 |
| TW | 201833389 A | 9/2018 |
| TW | 202012663 A | 4/2020 |
| TW | 202100776 A | 1/2021 |
| WO | WO2021047610 A1 | 3/2021 |

\* cited by examiner

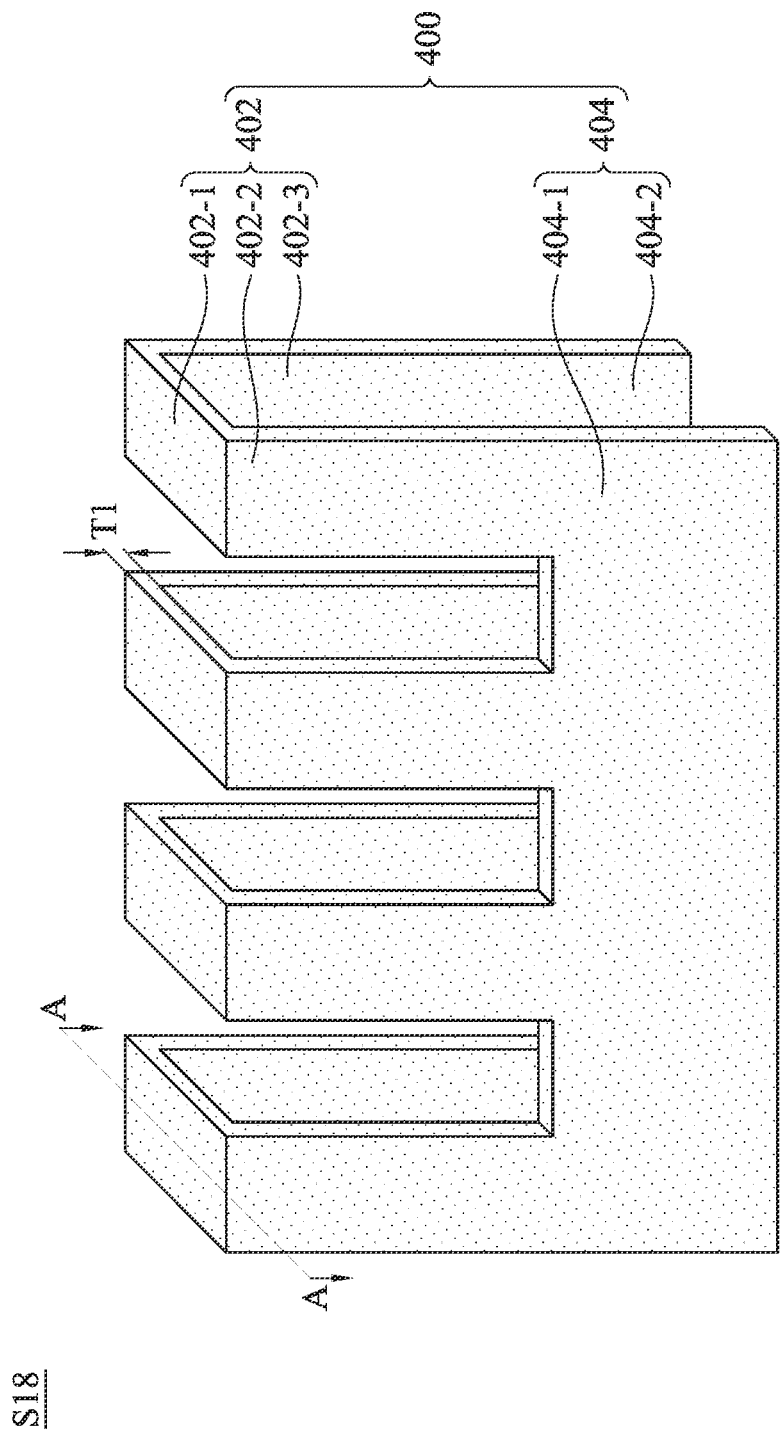
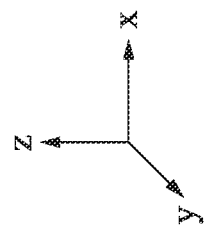
Fig. 5

METAL MASK HAVING A PLURALITY OF STRIP-SHAPED STRUCTURES

CROSS-REFERENCE TO RELATED APPLICATION

This application claims priority to Taiwan Application Ser. No. 110131682, filed Aug. 26, 2021, which is herein incorporated by reference in its entirety.

BACKGROUND

Field of Invention

The present disclosure relates to a method of fabricating a metal mask and the metal mask. More particularly, the present disclosure relates to a method of fabricating a three-dimensional metal mask and the three-dimensional metal mask.

Description of Related Art

The display device has been used in a variety of applications. The display device includes various electrical components and wires connecting the electrical components. For example, the wire can transmit signal to a thin film transistor (TFT) and apply a voltage to an electrode in the TFT. In response to the market demand, the screen to body ratio of the display device is being increased.

Therefore, the narrow bezel display device has been developed and become popular in the market. The peripheral area of the narrow bezel display device is effectively utilized to form the wires for electrical connection between the electrical components disposed on different sides of the substrate.

SUMMARY

An aspect of the present disclosure provides a method of fabricating a metal mask. The method of fabricating the metal mask includes receiving a conductive substrate with a first surface, a second surface opposite to the first surface, a third surface connecting the first and second surfaces, and a fourth surface opposite to the third surface and connecting the first and second surfaces. The method of fabricating the metal mask further includes forming trenches in a direction from the first surface to the second surface and protrusions in the conductive substrate. The trenches and the protrusions are alternately arranged. The method of fabricating the metal mask further includes filling the trenches with an insulation material covering a first area of the protrusions, forming a metal layer on the conductive substrate overlying a second area different from the first area of the protrusions, removing the insulation material, and removing the conductive substrate. The metal layer becomes a metal mask with a three-dimensional structure including strip-shaped structures.

An aspect of the present disclosure provides a metal mask. The metal mask includes a first board portion and strip-shaped structures connected to the first board portion. Two adjacent strip-shaped structures of the strip-shaped structures are spaced apart from each other. The strip-shaped structures comprise a first section having a first thickness and a second section having a second thickness. The second thickness is substantially the same as the first thickness. The second section connects the first board portion and the first section. A first angle is formed by the first section and the second section.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 5 are views of various intermediate stages of fabricating a metal mask according to some embodiments of the present disclosure.

DETAILED DESCRIPTION

Figure 1:
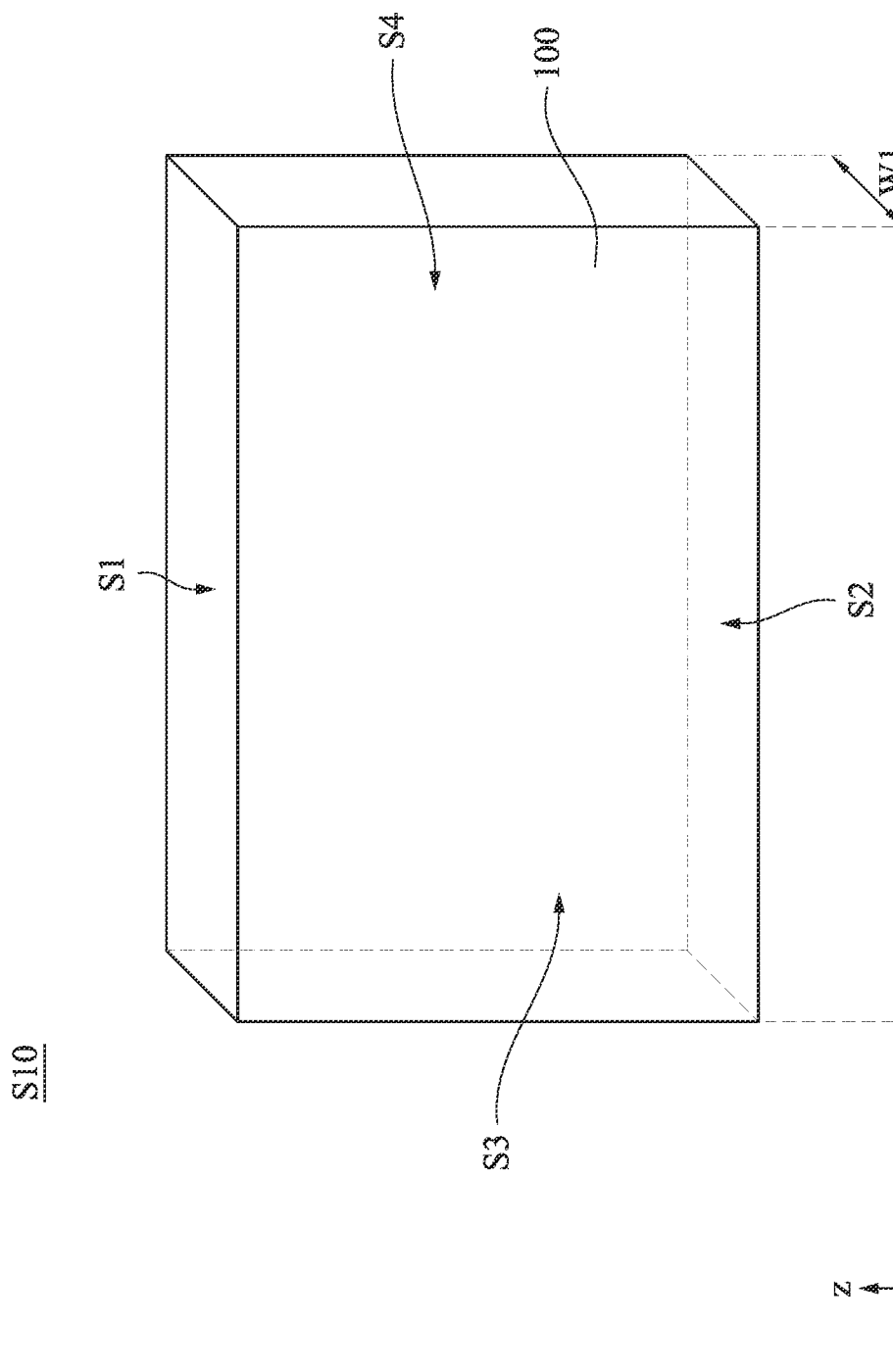

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the disclosure. For illustration clarity, many details of practice are explained in the following descriptions. However, it should be understood that these details of practice do not intend to limit the present disclosure. That is, these details of practice are not necessary in parts of embodiments of the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of ordinals such as first, second and third does not necessarily imply a ranked sense of order, but rather may only distinguish between multiple instances of an act or structure. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the fabrication of a display device, particularly a narrow bezel display device, a wire formed at an edge of a substrate in the display device by using a conductive through hole, lithography techniques, or etching techniques can electrically connect various electrical components separately disposed on two opposite sides of a substrate. However, manufacturing the conductive through hole in the substrate may not be fully established in the fabrication of the display device, and a lithography process and/or an etching process may complicate the fabrication of the display device. As a result, the fabrication difficulty and cost may be increased.

The present disclosure provides a metal mask with a three-dimensional structure and a method of fabricating thereof. The metal mask with the three-dimensional structure can be used to form wires at the edge of the substrate and between the electrical components which are separately disposed on two opposite sides of the substrate.

Referring to FIG. 1 to FIG. 5, FIG. 1 to FIG. 5 are views of various intermediate stages of fabricating the metal mask according to some embodiments of the present disclosure. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations in FIG. 1 to FIG. 5, and may be briefly described herein. Further, it will be understood that not all operations are necessarily present in each embodiment provided herein. Also, it will be understood that not all operations are necessary in some embodiments.

FIG. 1 illustrates step S10 of receiving a conductive substrate 100. The conductive substrate 100 can include a first surface S1 (e.g., parallel to the xy plane), a second surface S2 opposite to the first surface S1, a third surface S3 connecting the first surface S1 and the second surface S2 (e.g., parallel to the xz plane), and a fourth surface S4 opposite to the third surface S3 and connecting the first surface S1 and the second surface S2. The conductive substrate 100 includes any suitable conductive materials, such as metal. In some embodiments, the conductive substrate 100 may include Cu, Ni, Fe, Co, Sn, Cr, Ti, Al, other suitable metal, an alloy of the above-mentioned metal, or a combination thereof. For example, the conductive substrate 100 can include Ni. In some other embodiments, the conductive substrate 100 can be a stainless steel.

A length L1 (e.g., a dimension along the x axis) and a width W1 (e.g., a dimension along the y axis) of the conductive substrate 100 can be manipulated based on product designs and process conditions. In some embodiments, the length L1 and the width W1 of the conductive substrate 100 can be determined in step S10. In some other embodiments, the length L1 and the width W1 of the conductive substrate 100 can be determined in the subsequent step, for example in step S12 in the following context.

Figure 2:
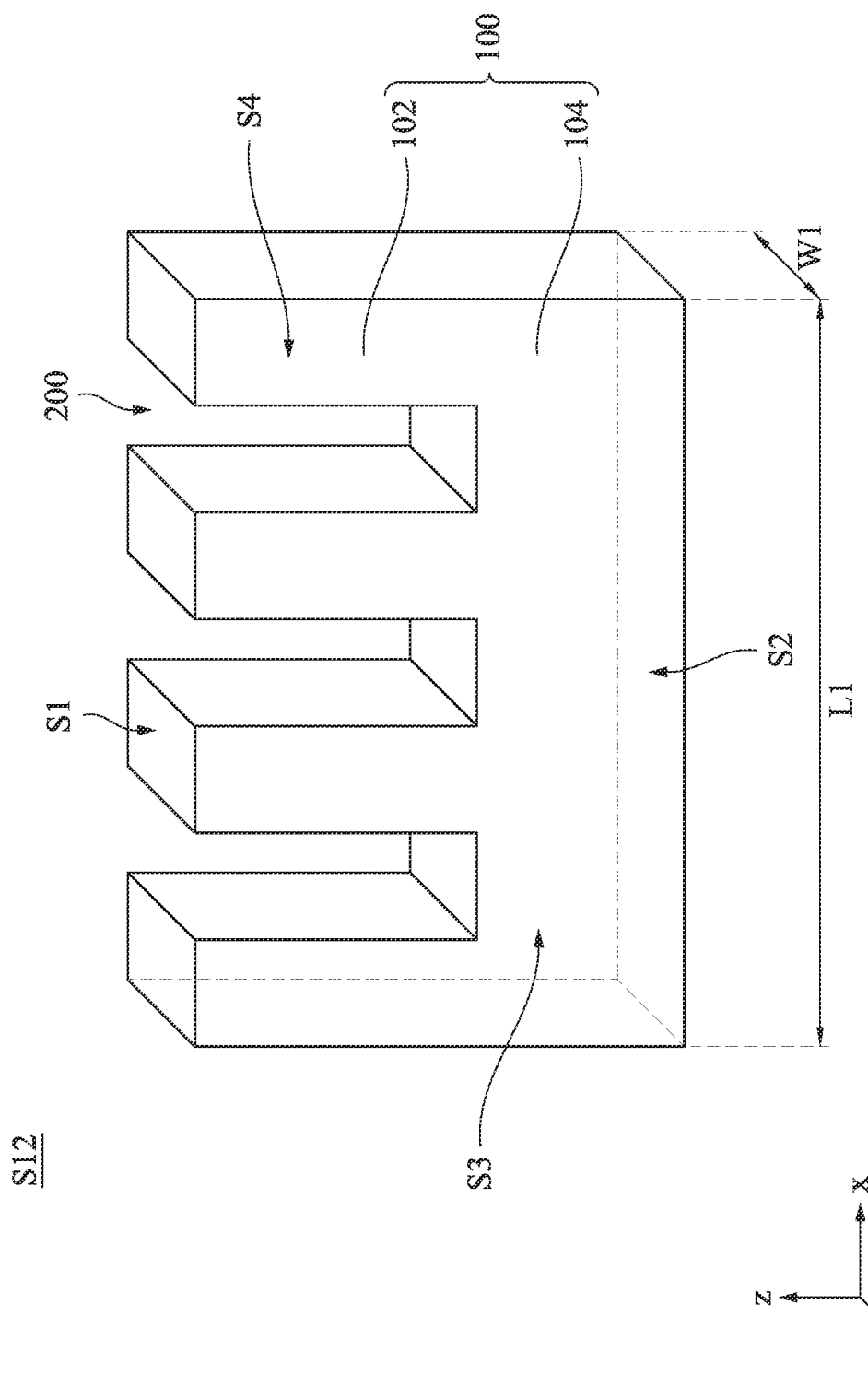

FIG. 2 illustrates step S12 of forming multiple trenches 200 in a direction from the first surface S1 to the second surface S2 (e.g., downward along the z axis) and multiples protrusions 102 in the conductive substrate 100. In some embodiments, the conductive substrate 100 can be machined to recess the first surface S1 of the conductive substrate 100, thereby forming the trenches 200 in the conductive substrate 100. In an embodiment as shown in FIG. 2, the trenches 200 extends through the third surface S3 and the fourth surface S4, implying that a length of each trench 200 along the y axis can be substantially the same as a distance between the third surface S3 and the fourth surface S4. That is, the length of each trench 200 along the y axis can be substantially the same as the width W1 of the conductive substrate 100.

The conductive substrate can include the protrusions 102 and a base 104 after the trenches are formed. In some embodiments, each trench 200 can be located two adjacent protrusions 102. In other words, each trench 200 and each protrusion 102 are alternately arranged. In some embodiments, the protrusions 102 can protrude from the base 104 and extend upward (e.g., upward along the z axis).

Figure 3:
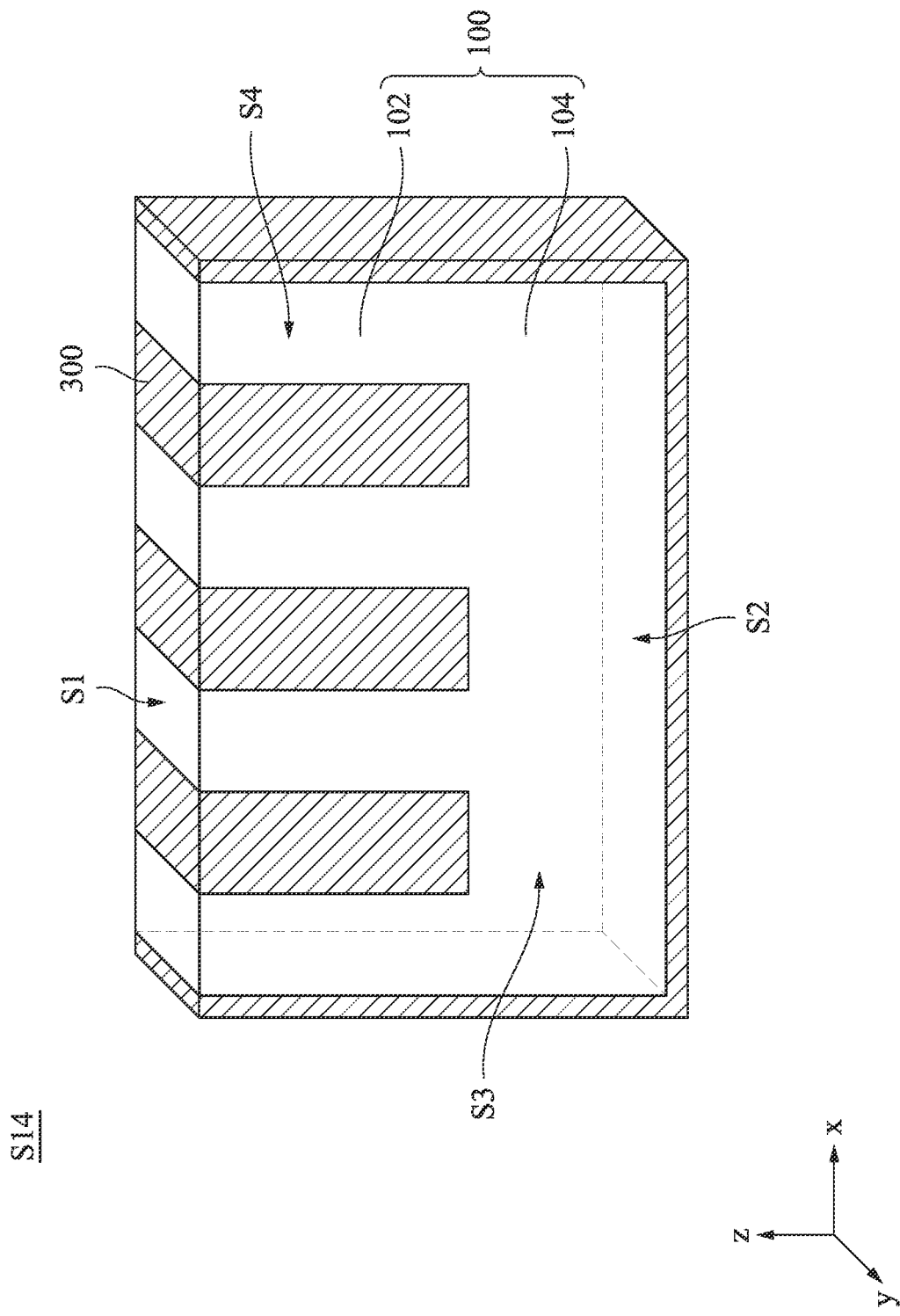

FIG. 3 illustrates step S14 of filling the trenches 200 (see FIG. 2) with a first insulation material 300. In some embodiments, the first insulation material 300 can cover a first area of the protrusions 102, as shown in FIG. 3. Specifically, the first insulation material 300 filled into the trenches 200 (see FIG. 2) may contact a sidewall of the protrusions 102 within the trenches 200 (see FIG. 2) and an upper surface of the base within the trenches 200 (see FIG. 2). In some embodiments, the first insulation material 300 can also cover an outer sidewall and a portion of surface of the conductive substrate 100 (e.g., the second surface S2). With the first insulation material 300, a predetermined area can be exposed. In some embodiments, different form the first area of the protrusions 102 covered by the first insulation material 300, a second area of the protrusions 102 can be exposed. A metal layer may later be formed on the exposed surface (i.e. the second area) in the following steps (will be discussed later). In an embodiment as shown in FIG. 3, the first surface S1, the third surface S3 and the fourth surface S4 may be the predetermined area, so the first surface S1, the third surface S3 and the fourth surface S4 may be exposed without coverage of the first insulation material 300.

Figure 4:
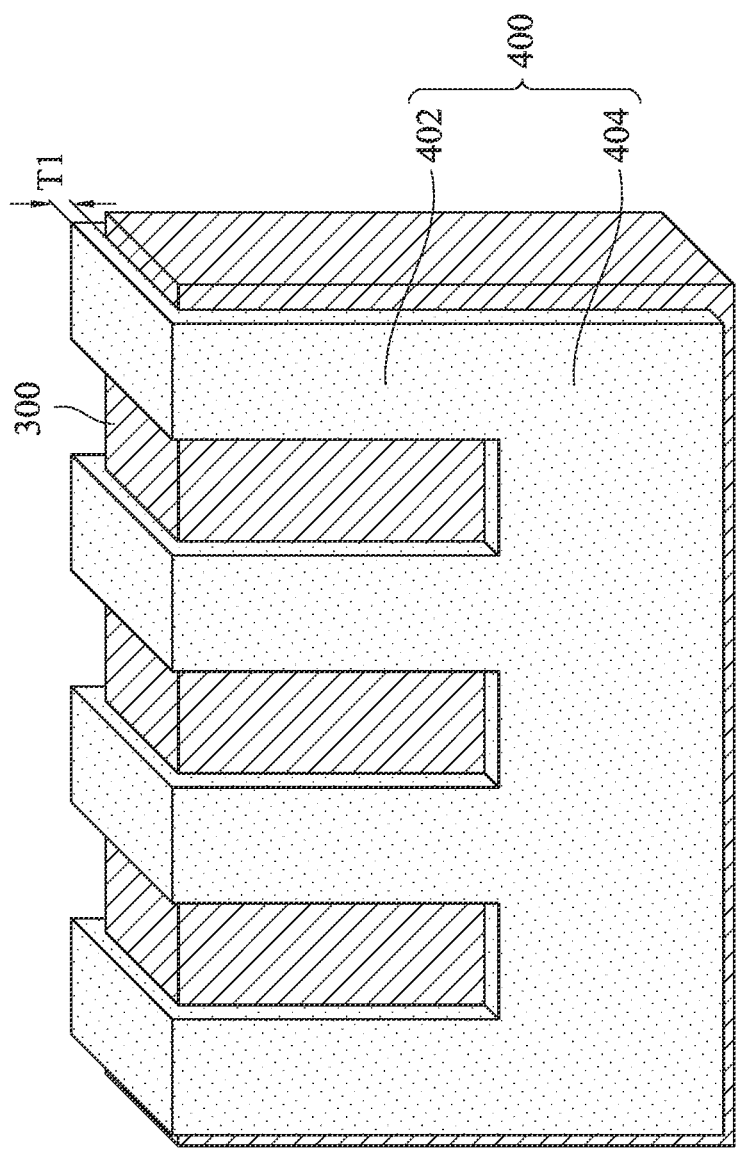

FIG. 4 illustrates step S16 of forming a metal layer 400 on the exposed surface of the conductive substrate 100. In some embodiments, the metal layer 400 can overlie the second area of the protrusions 102 which is not covered by the first insulation material 300 (see FIG. 3). In an embodiment as shown in FIG. 4, the metal layer 400 can overlie on the surface exposed in a structure of FIG. 3, for example the first surface S1, the third surface S3 and the fourth surface S4.

In a further description, the metal layer 400 may include multiple strip-shaped structures 402 and a board portion 404. The strip-shaped structures 402 can be a portion of the metal layer 400 overlying the protrusions 102. In an example, the strip-shaped structures 402 can be formed on and cover the first surface S1, the third surface S3 and the fourth surface S4 exposed on the protrusions 102 (see FIG. 3). The board portion 404 can be a portion of the metal layer 400 formed on the base 104. In an example, the board portion 404 can be formed on and cover the third surface S3 and the fourth surface S4 exposed on the base 104 (see FIG. 3).

In some embodiments, a method for forming the metal layer 400 on the conductive substrate 100 can include electrochemically depositing a material of the metal layer 400 on the conductive substrate 100. The material of the metal layer 400 may include Cu, Ni, Fe, Co, Sn, Cr, Ti, Al, other suitable metal, an alloy of the above-mentioned metal, or a combination thereof. For example, the material of the metal layer 400 can include Ni. During a process of the electrochemical deposition, the conductive substrate 100 shown in FIG. 3 can be provided with an electric current (e.g., connected to an external power supply). In this case, once an electrolyte touches the exposed surface in the conductive substrate 100, an ion (e.g., the material of the metal layer 400 in an ionic state) in the electrolyte may be reduced (that is, undergo a reduction reaction) to form the metal layer 400 on the exposed surface in the conductive substrate 100. Consequently, the exposed surface arranged by the first insulation material 300 on the conductive substrate 100 can determine a profile or design of the metal layer 400.

The metal layer 400 can include a thickness T1 between about 20 micrometers (μm) and about 300 μm. In some embodiments, the thickness T1 can be between about 20 μm and about 150 μm. If the thickness T1 is less than 20 μm, the process may become challenging. For example, in the subsequent process of peeling (e.g., removing the conductive substrate 100 and keeping the metal layer 400), the metal layer 400 with undesirably thin thickness may require precise operation and gentle handling to ensure an intact profile of the metal layer 400. If the thickness T1 is greater than 300 μm, no significant advantages can be obtained. In some embodiments, for example, a shadow effect may occur when the thickness T1 exceeds 300 μm. In some embodiments, the thickness T1 of the metal layer 400 can be a uniform thickness.

In some embodiments, a surface treatment can be performed on the conductive substrate 100 before the metal layer 400 is formed thereon. For example, in some embodiments in which a material included in the conductive substrate 100 is the same as a material included in the metal layer 400, performing the surface treatment on the conductive substrate 100 before depositing the metal layer 400 on the treated conductive substrate 100 can facilitate a separation between the conductive substrate 100 and the metal layer 400 in the subsequent process of peeling (e.g., removing the conductive substrate 100 and keeping the metal layer 400). In some embodiments, the surface treatment can include forming an oxide layer on the conductive substrate 100. In general, the surface treatment may not have influence on a formation of the metal layer 400.

FIG. 5 illustrates step S18 of removing the first insulation material 300, and further removing the conductive substrate 100 such that the metal layer 400 can become a metal mask 400 with a three-dimensional structure. As shown in FIG. 5, the metal mask 400 with the three-dimensional structure can have the strip-shaped structures 402, the board portion 404 and the thickness T1.

The metal mask 400 shown in FIG. 5 is further described. The board portion 404 of the metal mask 400 may include a first board portion 404-1 and a second board portion 404-2. In some embodiments, the first board portion 404-1 and the second board portion 404-2 can be parallel to each other. Two adjacent strip-shaped structures 402 of the strip-shaped structures 402 can be spaced apart from each other. Further, the strip-shaped structures 402 can connect the first board portion 404-1 and the second board portion 404-2. The strip-shaped structures 402 may include a first section 402-1, a second section 402-2 and a third section 402-3. In some embodiments, the first section 402-1 may be positioned above the second section 402-2 and the third section 402-3, and meanwhile connect the second section 402-2 and the third section 402-3. In addition, the second section 402-2 may connect the first board portion 404-1 and the first section 402-1, and the third section 402-3 may connect the second board portion 404-2 and the first section 402-1. In some embodiments, the second section 402-2 and the third section 402-3 can be parallel to each other.

In some embodiments, if the thickness T1 of the metal layer 400 can originally be a uniform thickness as described in FIG. 4, the metal mask 400 in FIG. 5 turned from the metal layer 400 can keep having the uniform thickness T1. Therefore, a thickness of the first section 402-1, a thickness of the second section 402-2 and a thickness of the third section 402-3 can be substantially the same. In other words, the first section 402-1, the second section 402-2 and the third section 402-3 can all have the thickness T1.

Figure 6:
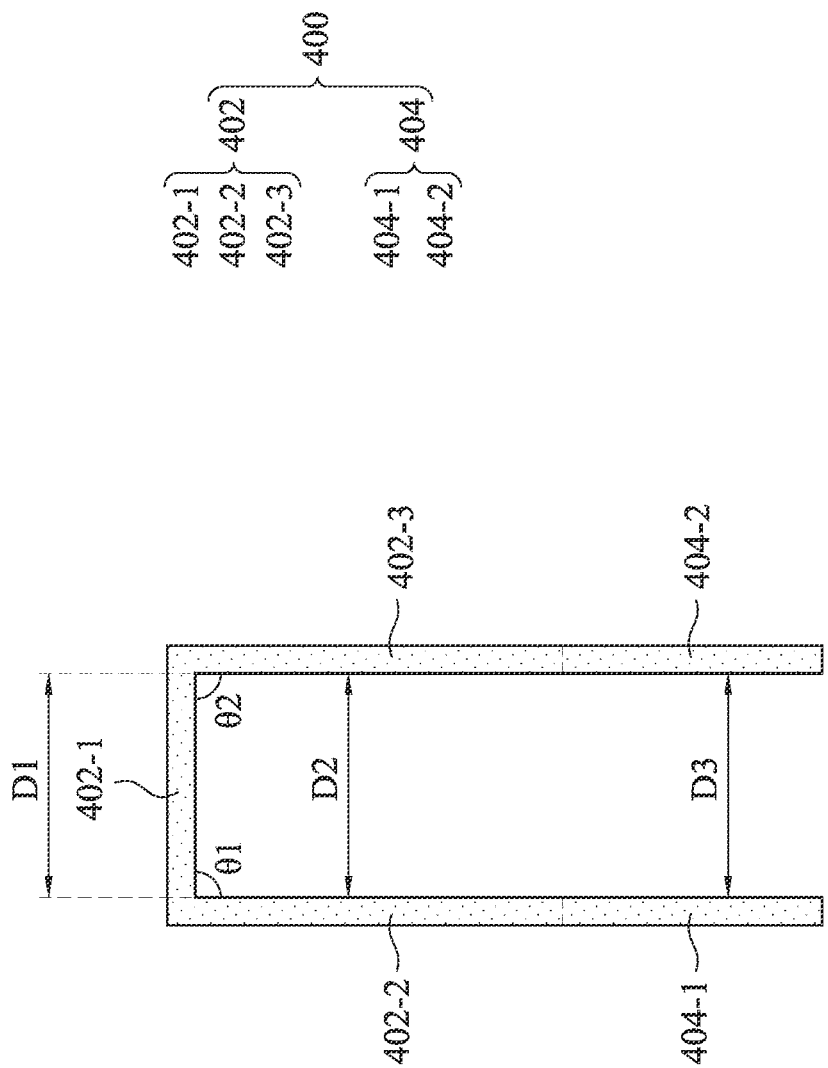
FIG. 6 is a cross-sectional view of a metal mask taken along line A-A shown in FIG. 5 according to some embodiments of the present disclosure.

Continuing in FIG. 5 and referring to FIG. 6 at the same time, FIG. 6 illustrates a cross-sectional view of the metal mask 400 taken along line A-A shown in FIG. 5 according to some embodiments of the present disclosure. In some embodiments as shown in FIG. 6, a cross-sectional structure of the metal mask 400 may be similar to an upside-down-U-shaped structure. A first angle 81 is formed by the first section 402-1 and the second section 402-2, and a second angle 82 is formed by the first section 402-1 and the third section 402-3. As discussed previously in FIG. 3, an arrangement of the first insulation material 300 on the conductive substrate 100 can therefore determine a profile or design of the metal mask 400.

In some embodiments, a length D1 of the first section 402-1 can substantially be the same as the width W1 of the conductive substrate 100 in FIG. 1. In some other embodiments, a distance D2 between an inner surface of the second section 402-2 and an inner surface of the third section 402-3 can substantially be the same as the width W1 of the conductive substrate 100 in FIG. 1 when the second section 402-2 and the third 403-2 are parallel to each other. In some other embodiments, a distance D3 between an inner surface of the first board portion 404-1 and an inner surface of the second board portion 404-2 can substantially be the same as the width W1 of the conductive substrate 100 in FIG. 1 when the second section 402-2 and the third 403-2 are parallel to each other as well as the first board portion 404-1 and the second board portion 404-2 are parallel to each other.

Figure 7:
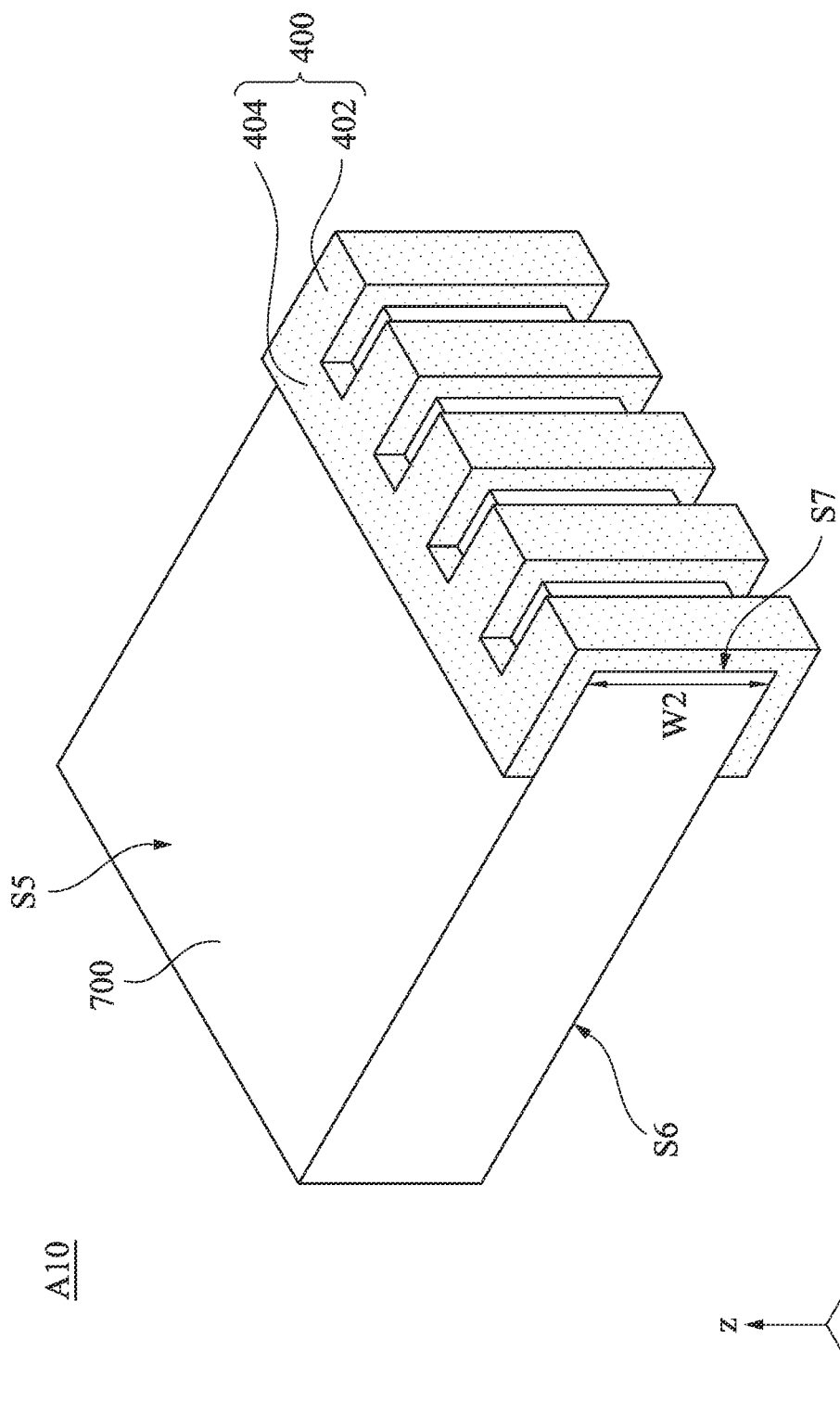
FIG. 7 to FIG. 9 are views of various intermediate stages of applying a metal mask shown in FIG. 5 according to some embodiments of the present disclosure.
Figure 8:
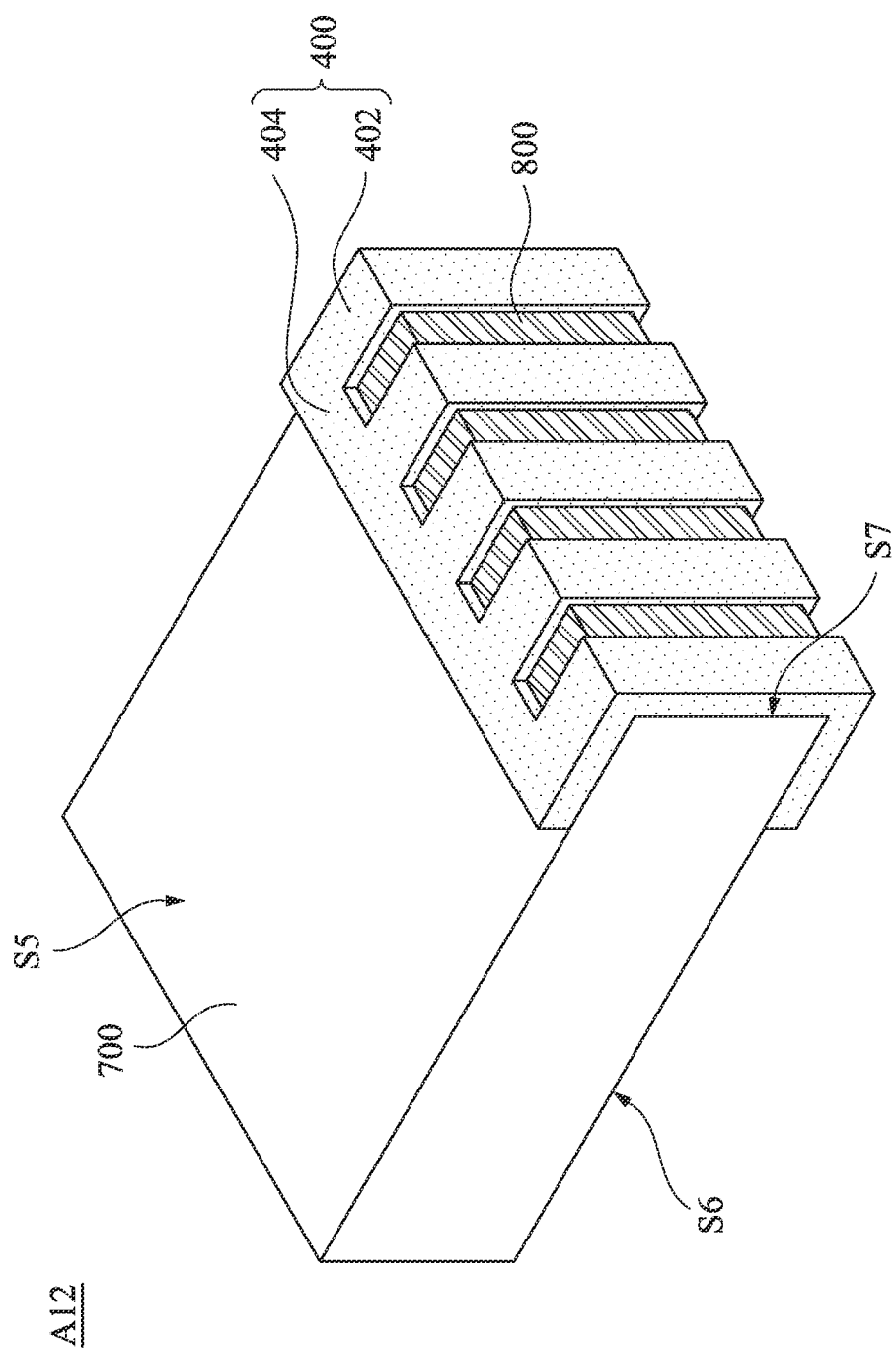
Figure 9:
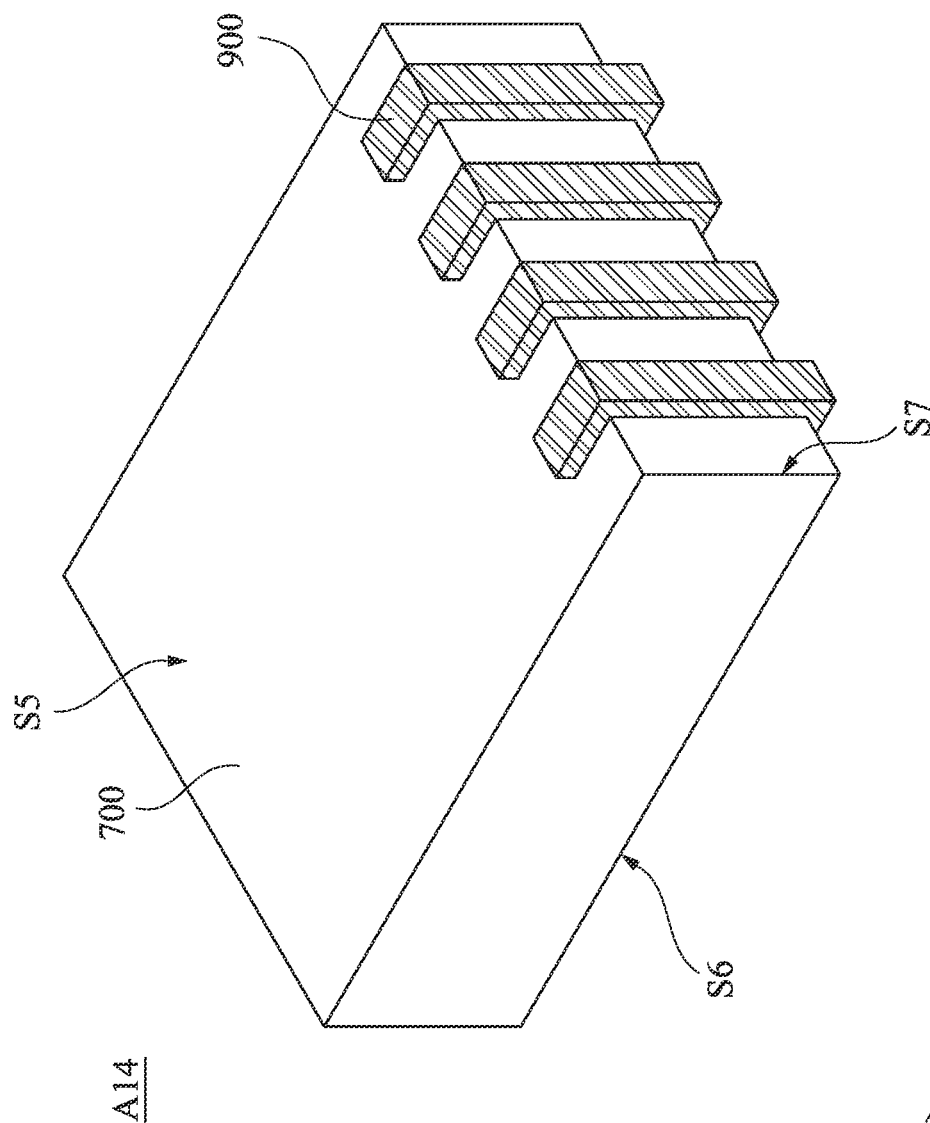

Referring to FIG. 7 to FIG. 9, FIG. 7 to FIG. 9 are views of various intermediate stages of applying the metal mask 400 shown in FIG. 5 according to some embodiments of the present disclosure. For example, the metal mask 400 is used to form wires at the edge of a slab-shaped substrate. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations in FIG. 7 to FIG. 9, and may be briefly described herein. Further, it will be understood that not all operations are necessarily present in each embodiment provided herein. Also, it will be understood that not all operations are necessary in some embodiments.

FIG. 7 illustrates step A10 of receiving a slab-shaped substrate 700 and disposing the metal mask 400 at the edge of the slab-shaped substrate 700. In detail, the board portion 404 of the metal mask 400 can directly contact a fifth surface S5 and a sixth surface S6 of the slab-shaped substrate 700. The fifth surface S5 and the sixth surface S6 are opposite to each other and may be parallel to the xy plane. The strip-shaped structures 402 of the metal mask 400 can directly contact the fifth surface S5, the sixth surface S6 and a seventh surface S7. The seventh surface S7 connects the fifth surface S5 and the sixth surface S6, and may be parallel to the yz plane.

The profile of the metal mask 400 is designed to be consistent with a profile of the slab-shaped substrate 700, thereby allowing the metal mask 400 to fit an edge area of the slab-shaped substrate 700. In some embodiments, a width W2 of the slab-shaped substrate 700 can substantially be the same as the length D1 of the first section 402-1 of the strip-shaped structures 402 (see FIG. 6).

FIG. 8 illustrates step A12 of forming a metal material 800 on an exposed portion of the slab-shaped substrate 700 without the metal mask 400 covered. Specifically, the metal material 800 can be formed between each of the strip-shaped structures 402. A thickness of the metal material 800 may be less than a thickness of the metal mask 400 (e.g. the thickness T1 shown in FIG. 5). In some embodiments, a mask (not illustrated here) may be used to cover some other portions of the slab-shaped substrate 700 to avoid the metal material 800 from appearing thereon. In some embodiments, the metal material 800 can be formed by a sputtering process, an evaporation process, or any suitable process. It is noted that, in an actual operation, the metal material 800 may be formed not only on the exposed portion of the slab-shaped substrate 700 but also on the metal mask 400. For clarity, FIG. 8 is simplified by omitting to illustrate a portion of the metal material 800 on the metal mask 400.

Due to a low coefficient of heat expansion, the metal mask 400 may not be changed with temperature in terms of structure such as expansion or contraction of volume during a process of forming the metal material 800 by the sputtering process, the evaporation process or the like. Therefore, the metal mask 400 can remain original arrangement, thereby ensuring process stability of forming the metal material 800 and further increasing reliability of metal wires formed later (e.g., metal wires 900 in below FIG. 9).

FIG. 9 illustrates step A14 of removing the metal mask 400 such that the remaining metal material 800 can become the metal wires 900 at the edge of the slab-shaped substrate 700. The metal wires 900 can extend on the fifth surface S5, the sixth surface S6 and the seventh surface S7 continuously. The metal wires 900 can electrically connect various electrical components (not illustrated here) separately disposed on the fifth surface S5 and sixth surface S6. With the metal mask 400, the metal wires 900 can be formed at the edge of the slab-shaped substrate 700 in a convenient way.

Figure 10:
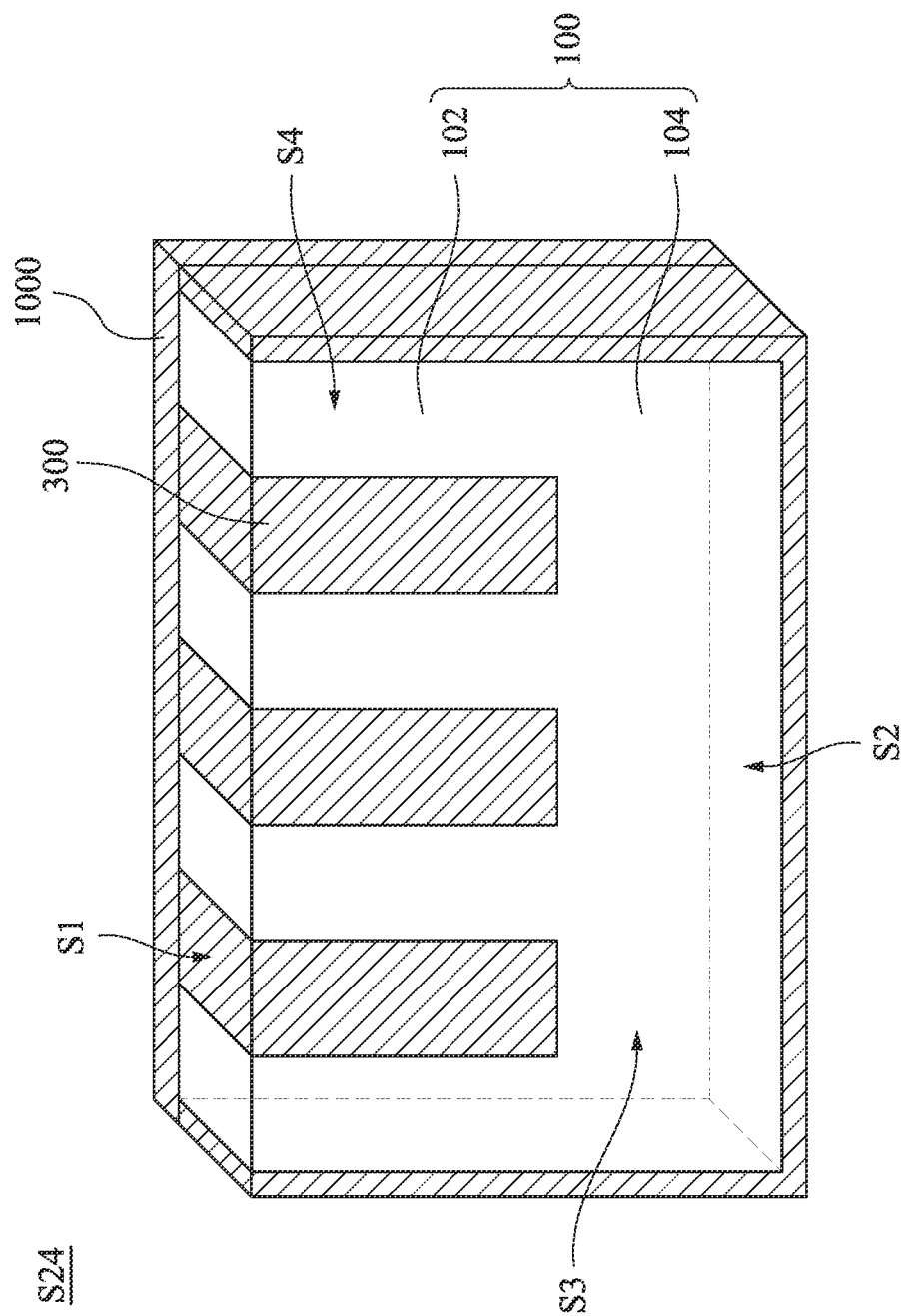
FIG. 10 to FIG. 12 are views of various intermediate stages of fabricating a metal mask according to some other embodiments of the present disclosure.
Figure 11:
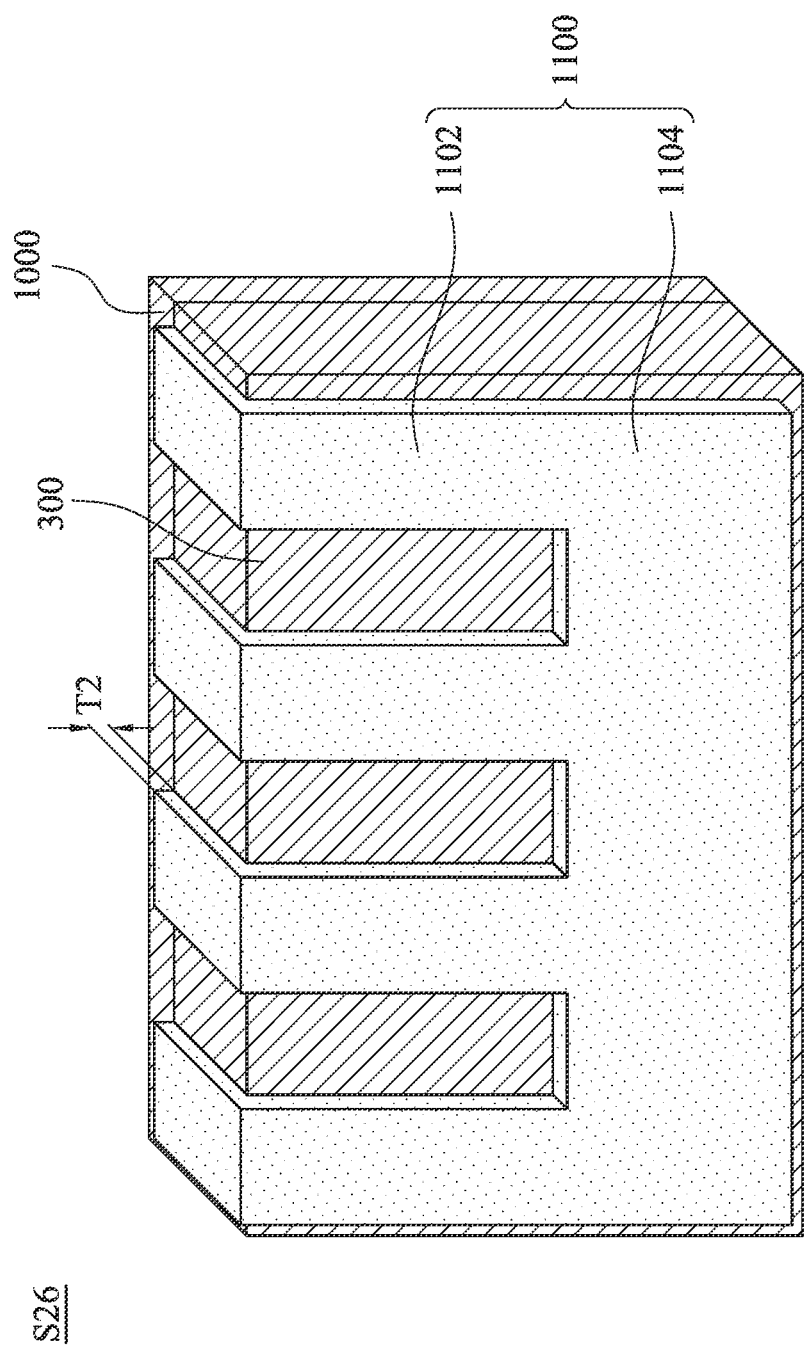
Figure 12:
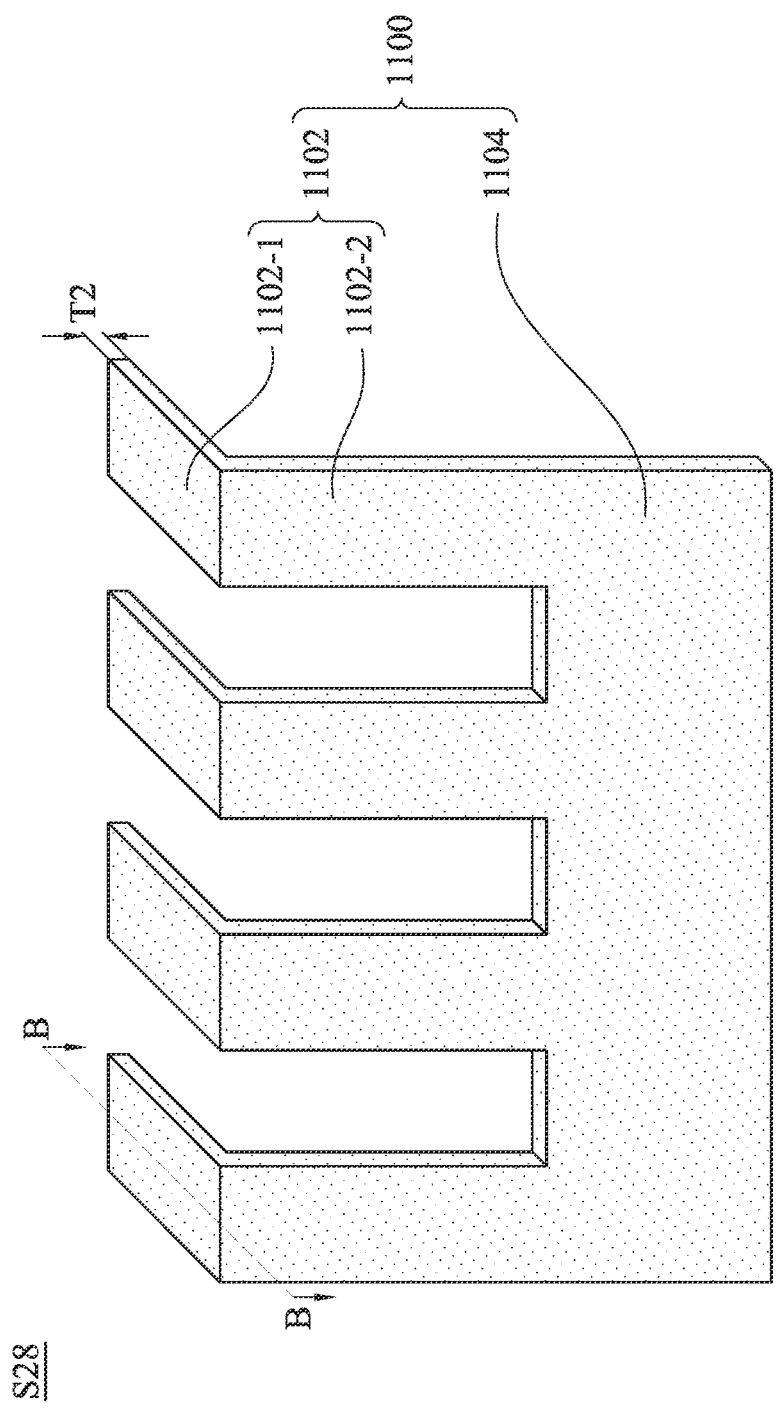

Referring to FIG. 10 to FIG. 12, FIG. 10 to FIG. 12 are views of various intermediate stages of fabricating a metal mask with another structure according to some other embodiments of the present disclosure. Operations for fabricating the metal mask with another structure can be similar to the operations for fabricating the metal mask 400 as above-mentioned description. For example, step S24 discussed later in FIG. 10 can be similar to step S14 discussed in FIG. 3, step S26 discussed later in FIG. 11 can be similar to step S16 discussed in FIG. 4, and step S28 discussed later in FIG. 12 can be similar to step S18 discussed in FIG. 5. Further, step S10 discussed in FIG. 1 and step S12 discussed in FIG. 2 can be directly implemented in the operations for fabricating the metal mask with another structure. Therefore, no further discussions are elaborated for step S10 and step S12.

Additional operations can be provided before, during, and/or after these operations in FIG. 10 to FIG. 12, and may be briefly described herein. Further, it will be understood that not all operations are necessarily present in each embodiment provided herein. Also, it will be understood that not all operations are necessary in some embodiments.

FIG. 10 illustrates step S24 of additionally forming a second insulation material 1000 on the fourth surface S4 base on the structure in FIG. 3. Therefore, the first surface S1 and the third surface S3 may be the predetermined area to be exposed without coverage of the first insulation material 300 and the second insulation material 1000. In some embodiments, a material of the second insulation material 1000 can substantially identical to a material of the first insulation material 300.

FIG. 11 illustrates step S26 of forming a metal layer 1100 on an exposed surface of the conductive substrate 100. In other words, the metal layer 1100 can partially overlie the protrusions 102 which are not covered by the first insulation material 300 and the second insulation material 1000 (see FIG. 10). In an embodiment as shown in FIG. 11, the metal layer 1100 can overlie on the exposed surface in a structure of FIG. 11, for example the first surface S1 and the third surface S3.

In a further description, the metal layer 1100 may include multiple strip-shaped structures 1102 and a board portion 1104. The strip-shaped structures 1102 can be a portion of the metal layer 1100 formed on the protrusions 102. In an example, the strip-shaped structures 1102 can be formed on and cover the first surface S1 and the third surface S3 exposed on the protrusions 102 (see FIG. 10). The board portion 1104 can be a portion of the metal layer 1100 formed on the base 104. In an example, the board portion 1104 can be formed on and cover the third surface S3 exposed on the base 104 (see FIG. 10).

In some embodiments, a method for forming the metal layer 1100 on the conductive substrate 100 can include electrochemically depositing a material of the metal layer 1100 on the conductive substrate 100. The material of the metal layer 1100 may include Cu, Ni, Fe, Co, Sn, Cr, Ti, Al, other suitable metal, an alloy of the above-mentioned metal, or a combination thereof. For example, the material of the metal layer 1100 can include Ni. During a process of the electrochemical deposition, the conductive substrate 100 shown in FIG. 10 can be provided with an electric current (e.g., connected to an external power supply). In this case, once an electrolyte touches the exposed surface in the conductive substrate 100, an ion (e.g., the material of the metal layer 1100 in an ionic state) in the electrolyte may be reduced (that is, undergo a reduction reaction) to form the metal layer 1100 on the exposed surface in the conductive substrate 100. Consequently, the exposed surface arranged by the first insulation material 300 and the second insulation material 1000 on the conductive substrate 100 can determine a profile or design of the metal layer 1100.

The metal layer 1100 can include a thickness T2 between about 20 μm and about 300 μm. In some embodiments, the thickness T2 can be between about 20 μm and about 150 μm. If the thickness T2 is less than 20 μm, the process may become challenging. For example, in the subsequent process of peeling (e.g., removing the conductive substrate 100 and keeping the metal layer 1100), the metal layer 1100 with undesirably thin thickness may require more precise operation and gentle handling to ensure an intact profile of the metal layer 1100. If the thickness T2 is greater than 300 μm, no significant advantages can be obtained. In some embodiments, for example, a shadow effect may occur when the thickness T2 exceeds 300 μm. In some embodiments, the thickness T2 of the metal layer 1100 can be a uniform thickness.

Similarly, a surface treatment can be performed on the conductive substrate 100 before the metal layer 1100 is formed thereon. Operations for performing the surface treatment are as discussed previously in FIG. 4, and thus no further description is elaborated herein.

FIG. 12 illustrates step S28 of removing the first insulation material 300 and the second insulation material 1000, and further removing the conductive substrate 100 such that the metal layer 1100 can become a metal mask 1100 with a three-dimensional structure. As shown in FIG. 12, the metal mask 1100 with the three-dimensional structure can have the strip-shaped structures 1102, the board portion 1104 and the thickness T2.

The metal mask 1100 shown in FIG. 12 is further described. Two adjacent strip-shaped structures 1102 of the strip-shaped structures 1102 can be spaced apart from each other. Further, the strip-shaped structures 1102 can connect the board portion 1104. The strip-shaped structures 1102 may include a first section 1102-1 and a second section 1102-2. In some embodiments, the first section 1102-1 may be positioned above the second section 1102-2, and meanwhile connected to the second section 1102-2. In some embodiments, the metal mask 110 can be corresponded to the metal mask 400 shown in FIG. 5. For example, the first section 1102-1 can be corresponded to the first section 402-1 shown in FIG. 5, the second section 1102-2 can be corresponded to the second section 402-2 shown in FIG. 5, and the board portion 1104 can be corresponded to the first board portion 404-1.

In some embodiments, if the thickness T2 of the metal layer 1100 can originally be a uniform thickness as described in FIG. 11, the metal mask 1100 in FIG. 12 turned from the metal layer 1100 can keep having the uniform thickness T2. Therefore, a thickness of the first section 1102-1 and a thickness of the second section 1102-2 can be substantially the same. In other words, the first section 1102-1 and the second section 1102-2 can both have the thickness T2.

Figure 13:
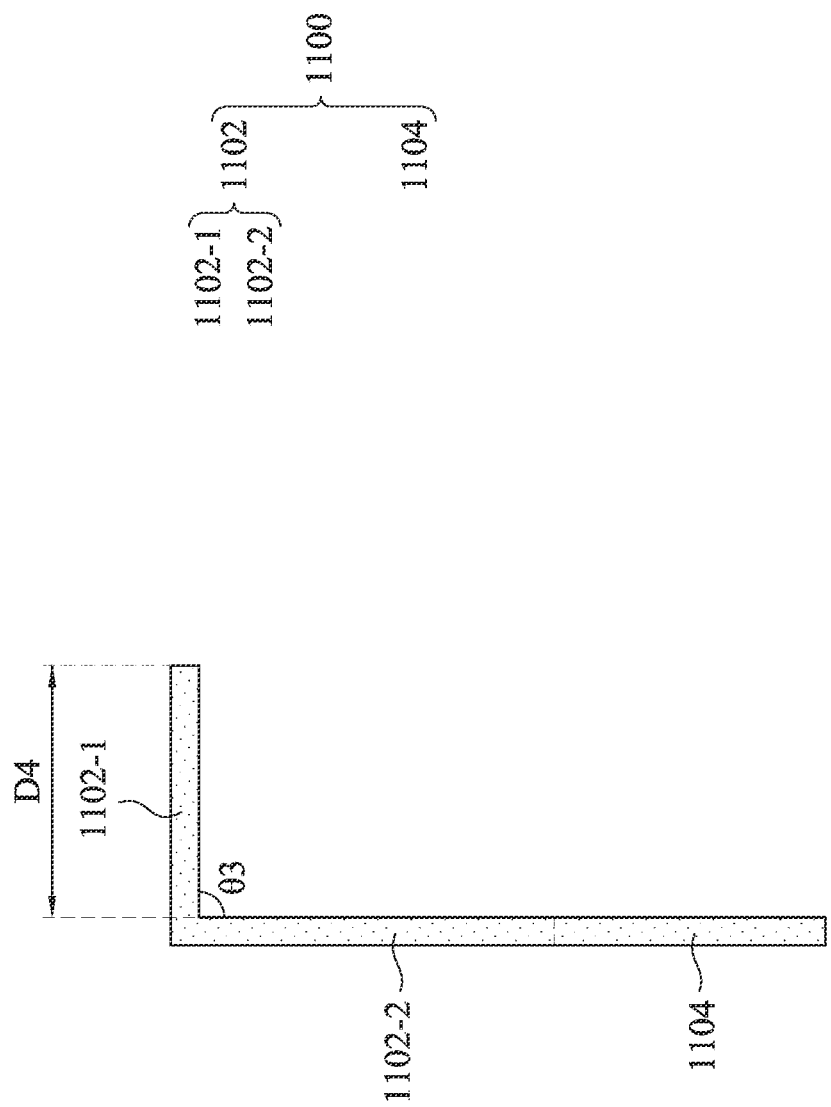
FIG. 13 is a cross-sectional of a metal mask taken along line B-B shown in FIG. 12 according to some other embodiments of the present disclosure.

Continuing in FIG. 12 and referring to FIG. 13 at the same time, FIG. 13 illustrates a cross-sectional view of the metal mask 1100 taken along line B-B shown in FIG. 12 according to some other embodiments of the present disclosure. In some embodiments as shown in FIG. 13, a cross-sectional structure of the metal mask 1100 may be similar to an upside-down-L-shaped structure. A third angle 83 is formed by the first section 1102-1 and the second section 1102-2. As discussed previously in FIG. 10, an arrangement of the first insulation material 300 and the second insulation material 1000 on the conductive substrate 100 can therefore determine a profile or design of the metal mask 1100. In some embodiments, a length D4 of the first section 1102-1 can substantially be the same as the width W1 of the conductive substrate 100 in FIG. 1.

Referring to FIG. 14 to FIG. 17, FIG. 14 to FIG. 17 are views of various intermediate stages of applying the metal mask 1100 shown in FIG. 12 according to some other embodiments of the present disclosure. For example, the metal mask 1100 is used to form wires at the edge of a slab-shaped substrate. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations in FIG. 14 to FIG. 17, and may be briefly described herein. Further, it will be understood that not all operations are necessarily present in each embodiment provided herein. Also, it will be understood that not all operations are necessary in some embodiments.

Figure 14:
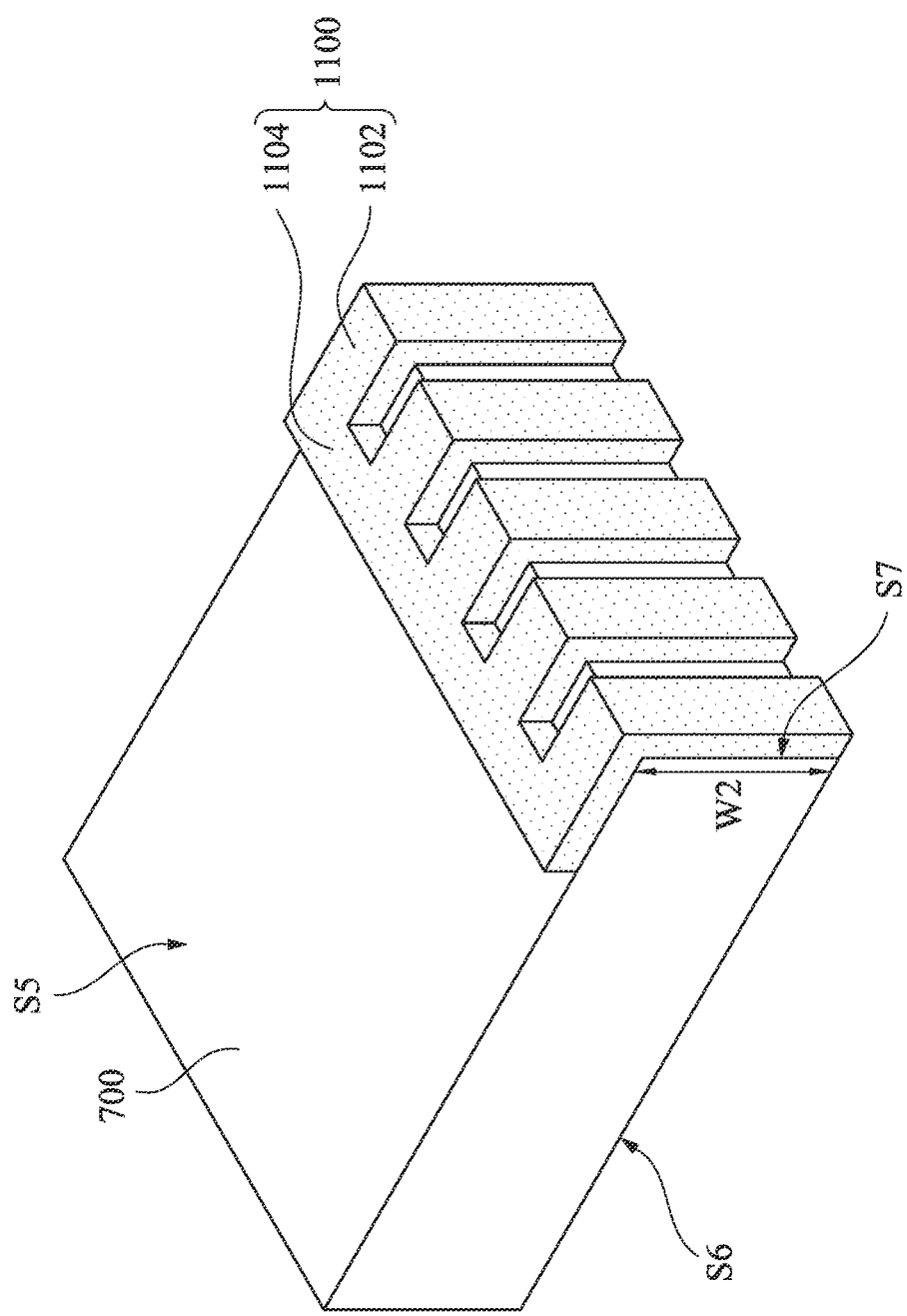
FIG. 14 to FIG. 17 are views of various intermediate stages of applying a metal mask shown in FIG. 12 according to some other embodiments of the present disclosure.

FIG. 14 illustrates step A20 of receiving the slab-shaped substrate 700 and disposing the metal mask 1100 at the edge of the slab-shaped substrate 700. In detail, the board portion 1104 of the metal mask 1100 can directly contact the fifth surface S5 of the slab-shaped substrate 700 which may be parallel to the xy plane. The strip-shaped structures 1102 of the metal mask 1100 can directly contact the fifth surface S5 as well as the seventh surface S7 which may be parallel to the yz plane.

The profile of the metal mask 1100 is designed to be consistent with a profile of the slab-shaped substrate 700, thereby allowing the metal mask 1100 to fit the edge area of the slab-shaped substrate 700. In some embodiments, the width W2 of the slab-shaped substrate 700 can substantially be the same as the length D4 of the first section 1102-1 of the strip-shaped structures 1102 (see FIG. 13). In some other embodiments, the width W2 of the slab-shaped substrate 700 can be less than the length D4 of the first section 1102-1 of the strip-shaped structures 1102 (see FIG. 13).

Figure 15:
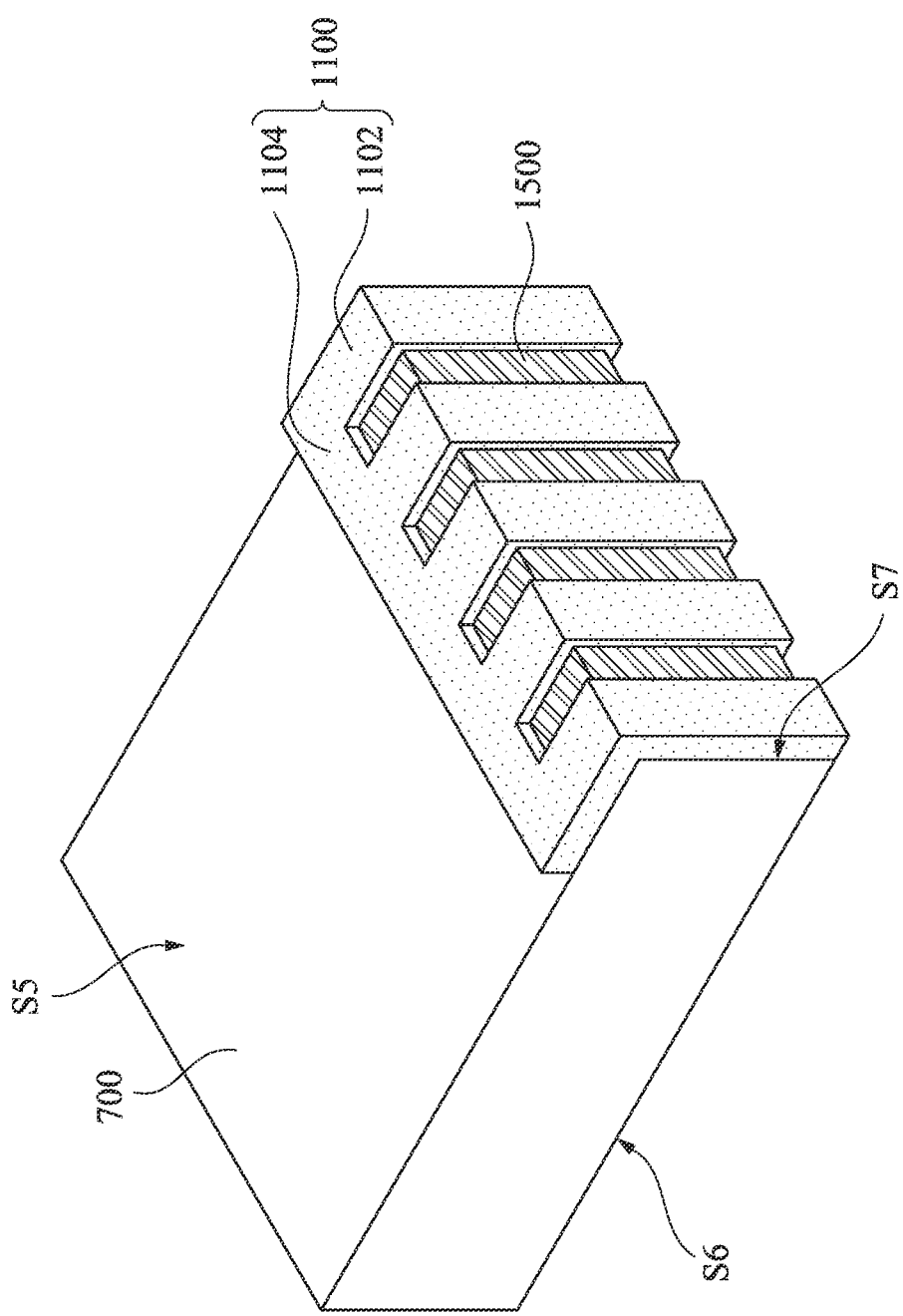

FIG. 15 illustrates step A22 of forming a first metal material 1500 on an exposed portion of the slab-shaped substrate 700 without the metal mask 1100 covered. In an embodiment as illustrated in FIG. 15, the first metal material 1500 can be formed on the fifth surface S5 and the seventh surface S7. Specifically, the first metal material 1500 can be formed between each of the strip-shaped structures 1102. A thickness of the first metal material 1500 may be less than a thickness of the metal mask 1100 (e.g. the thickness T2 shown in FIG. 12). In some embodiments, a mask (not illustrated here) may be used to cover some other portions of the slab-shaped substrate 700 to avoid the first metal material 1500 from appearing thereon. In some embodiments, the first metal material 1500 can be formed by a sputtering process, an evaporation process, or any suitable process. It is noted that, in an actual operation, the first metal material 1500 may be formed not only on the exposed portion of the slab-shaped substrate 700 but also on the metal mask 1100. For clarity, FIG. 15 is simplified by omitting to illustrate a portion of the first metal material 1500 on the metal mask 1100.

Figure 16:
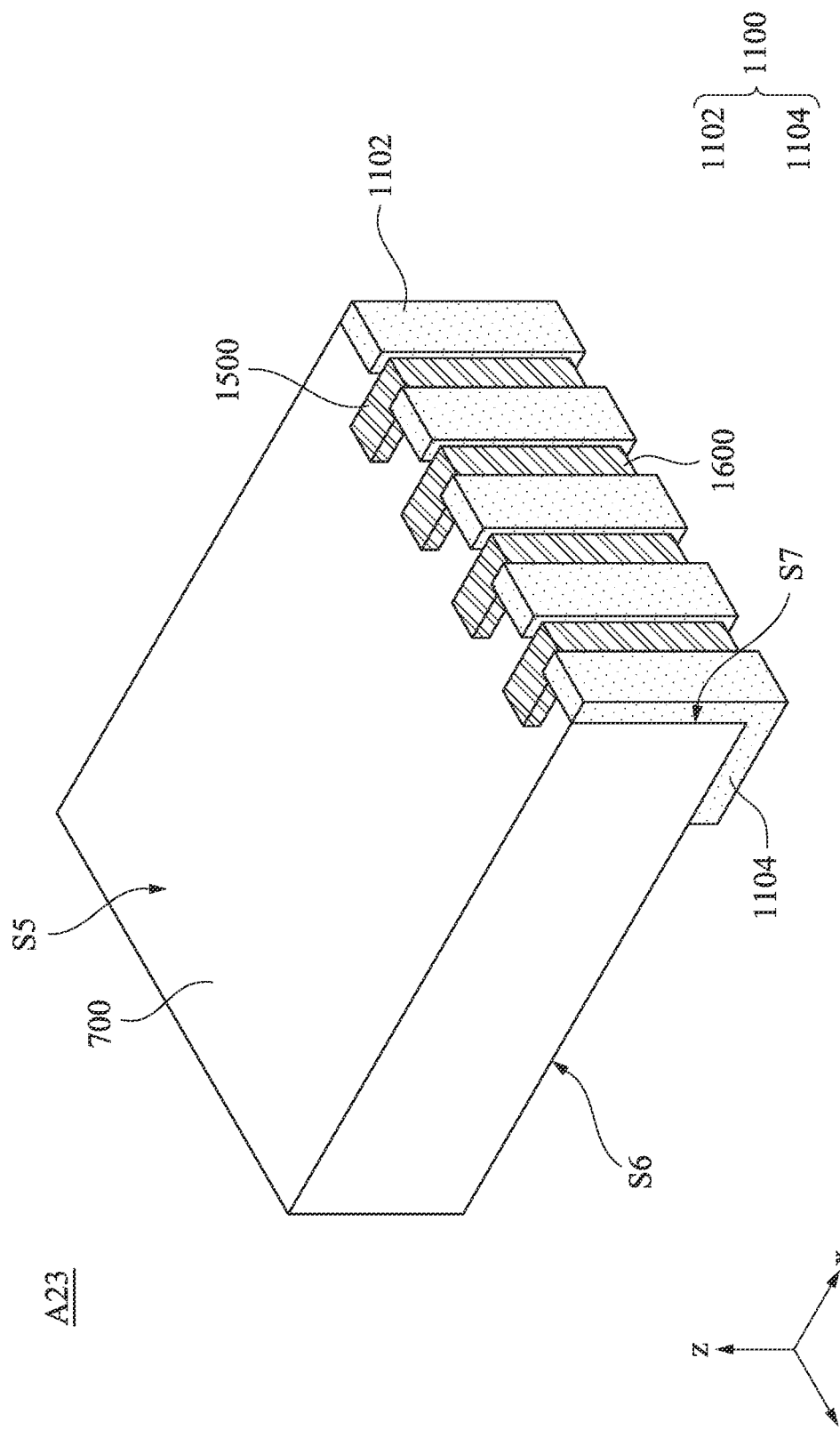

FIG. 16 illustrates step A23 of inverting the metal mask 1100 in FIG. 15 and then disposing the metal mask 1100 at the same edge of the slab-shaped substrate 700. In an embodiment as illustrated in FIG. 16, the board portion 1104 of the metal mask 1100 can directly contact the sixth surface S6 of the slab-shaped substrate 700. The strip-shaped structures 1102 of the metal mask 1100 can directly contact the sixth surface S6 as well as the seventh surface S7.

It is noted that, in step A23, a location on the seventh surface S7 where the metal mask 1100 is disposed can be corresponding aligned with a location on the seventh surface S7 where the first metal material 1500 is formed. In other words, that the first metal material 1500 and the strip-shaped structures 1102 are alternately disposed on the seventh surface S7 can be observed after the metal mask 1100 is disposed at the same edge of the slab-shaped substrate 700.

Subsequently, a second metal material 1600 can be formed on an exposed portion of the slab-shaped substrate 700 without the metal mask 1100 covered. In an embodiment as illustrated in FIG. 16, the second metal material 1600 can be formed on the sixth surface S6 and the seventh surface S7. Specifically, the second metal material 1600 can be formed between each of the strip-shaped structures 1102. A thickness of the second metal material 1600 may be less than a thickness of the metal mask 1100 (e.g. the thickness T2 shown in FIG. 12). In some embodiments, a mask (not illustrated here) may be used to cover some other portions of the slab-shaped substrate 700 to avoid the second metal material 1600 from appearing thereon.

In some embodiments, the second metal material 1600 can be formed by a sputtering process, an evaporation process, or any suitable process. It is noted that, in an actual operation, the second metal material 1600 may be formed not only on the exposed portion of the slab-shaped substrate 700 but also on the metal mask 1100. For clarity, FIG. 16 is simplified by omitting to illustrate a portion of the second metal material 1600 on the metal mask 1100.

Further, since a metal material (e.g., the first metal material 1500 and the second metal material 1600) is repeatedly formed on the seventh surface S7 in step A22 and A23, the above-mentioned metal material can be a double-layer stack including the first metal material 1500 and the second metal material 1600. In some embodiments, a thickness of the above-mentioned double-layer stack may be less than a thickness of the metal mask 1100 (e.g. the thickness T2 shown in FIG. 12).

Figure 17:
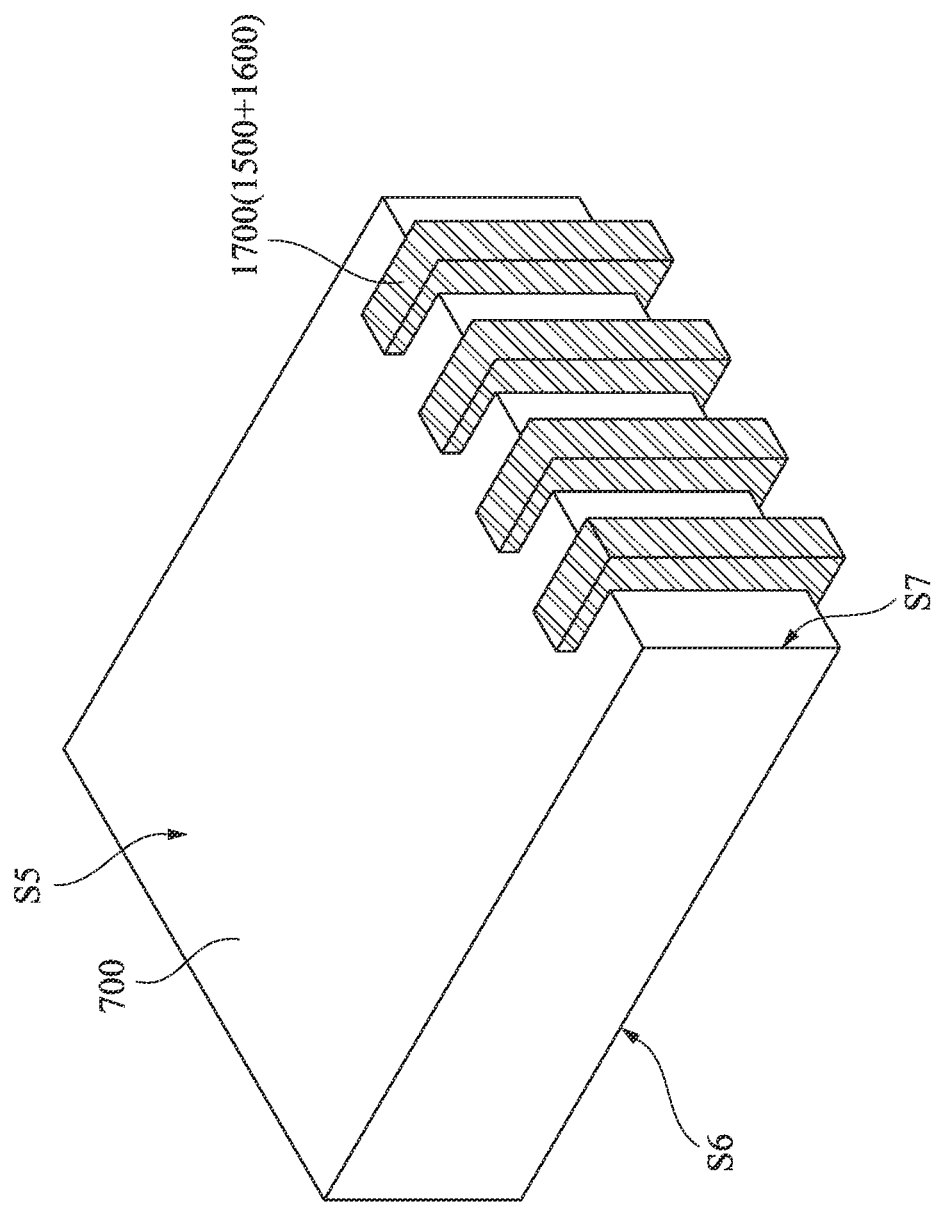

FIG. 17 illustrates step A24 of removing the metal mask 1100 such that the first metal material 1500 and the second metal material 1600 are remained and can collectively become metal wires 1700 at the edge of the slab-shaped substrate 700. The metal wires 1700 can extend on the fifth surface S5, the sixth surface S6 and the seventh surface S7 continuously. The metal wires 1700 can electrically connect various electrical components (not illustrated here) separately disposed on the fifth surface S5 and sixth surface S6. A thickness of the metal wires 1700 on the seventh surface S7 may be greater than a thickness of the metal wires 1700 either on the fifth surface S5 or the sixth surface S6. In some embodiments, the thickness of the metal wires 1700 on the seventh surface S7 may be twice the thickness of the metal wires 1700 on the fifth surface S5 or the sixth surface S6.

The present disclosure discloses various embodiments to provide a metal mask and a method of fabricating thereof. Thus, a metal mask with a three-dimensional structure can be formed through a more convenient process.

In addition, the metal mask with the three-dimensional structure disclosed in the present disclosure can be made of metal. Due to a lower coefficient of heat expansion of the metal than other materials (e.g., polymer), the metal mask may be capable of a wide range of operation temperature and better process reliability when the metal mask is used in a process related to heating or change of temperature. Further, the metal mask with the three-dimensional structure disclosed in the present disclosure can fit an edge area of a slab-shape substrate. Then, by a sputter process or an evaporation process through the metal mask, metal wires can be formed on three surfaces near the edge area of the slab-shape substrate to electrically connect various electrical components separately disposed on two opposite sides of the slab-shaped substrate. Thus, using a metal mask during forming the metal wires near the edge area of the slab-shaped substrate can simplify fabrication process and reduce process cost.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A metal mask, comprising:
    a first board portion;
    a second board portion; and
    a plurality of strip-shaped structures connected to the first board portion and the second board portion, wherein any two adjacent strip-shaped structures of the plurality of strip-shaped structures are spaced apart from each other, and wherein the plurality of strip-shaped structures comprise:
        a first section having a first thickness;
        a second section having a second thickness same as the first thickness of the first section and a thickness of the first board portion, wherein the second section connects the first board portion and the first section, an outer surface of the second section is coplanar with an outer surface of the first board portion, and a first angle is formed by the first section and the second section; and
        a third section connecting the first section and the second board portion.

2. The metal mask of claim 1, wherein a second angle is formed by the first section and the third section.

3. The metal mask of claim 1, wherein the third section has a third thickness same as the first thickness and the second thickness.

4. The metal mask of claim 1, wherein the second section and the third section are parallel to each other.

5. The metal mask of claim 1, wherein the first board portion and the second board portion are parallel to each other.

* * * * *